United States Patent [19]

Davenport

[11] Patent Number: 4,859,961
[45] Date of Patent: Aug. 22, 1989

[54] WIDE BANDWIDTH PUSH-PULL PARALLEL AMPLIFIER

[75] Inventor: William H. Davenport, Hillsboro, Oreg.

[73] Assignee: TriOuint Semiconductor, Inc., Beaverton, Oreg.

[21] Appl. No.: 285,993

[22] Filed: Dec. 19, 1988

[51] Int. Cl.$^4$ .............................................. H03F 3/45
[52] U.S. Cl. ..................................... 330/253; 330/295
[58] Field of Search ............... 330/252, 253, 255, 262, 330/269, 277, 307, 311, 295, 151

[56] References Cited

U.S. PATENT DOCUMENTS

| | | | |
|---|---|---|---|
| 4,052,679 | 10/1977 | Hosoya | 330/261 |
| 4,070,633 | 1/1978 | Gay | 330/295 X |
| 4,227,256 | 10/1980 | O'Keefe | 455/251 |
| 4,333,058 | 6/1982 | Hoover | 330/253 |
| 4,498,054 | 2/1985 | Fukuda et al. | 330/261 |
| 4,532,479 | 7/1985 | Blauschild | 330/261 |
| 4,596,958 | 6/1986 | Graene et al. | 330/151 X |
| 4,599,575 | 7/1986 | Bernard | 330/258 |
| 4,649,352 | 3/1987 | Blauschild | 330/261 |
| 4,748,422 | 5/1988 | Matsumoto et al. | 330/252 |

Primary Examiner—Steven Mottola
Attorney, Agent, or Firm—Peter J. Meza

[57] ABSTRACT

A wide bandwidth push-pull parallel amplifier cicuit is provided that includes a main amplifier stage and a parallel stage comprising a transimpedance amplifier and a follower circuit. Both amplifier stage inputs are coupled to the amplifier circuit's input terminals. The output from the main amplifier stage is coupled to the input of the follower circuit. The output of the follower is summed with the output of the transimpedance amplifier to provide a voltage output. The gain bandwidth product of the amplifier circuit is improved beyond that of a single stage while maintaining the delay of a single stage.

4 Claims, 1 Drawing Sheet

U.S. Patent     Aug. 22, 1989     4,859,961
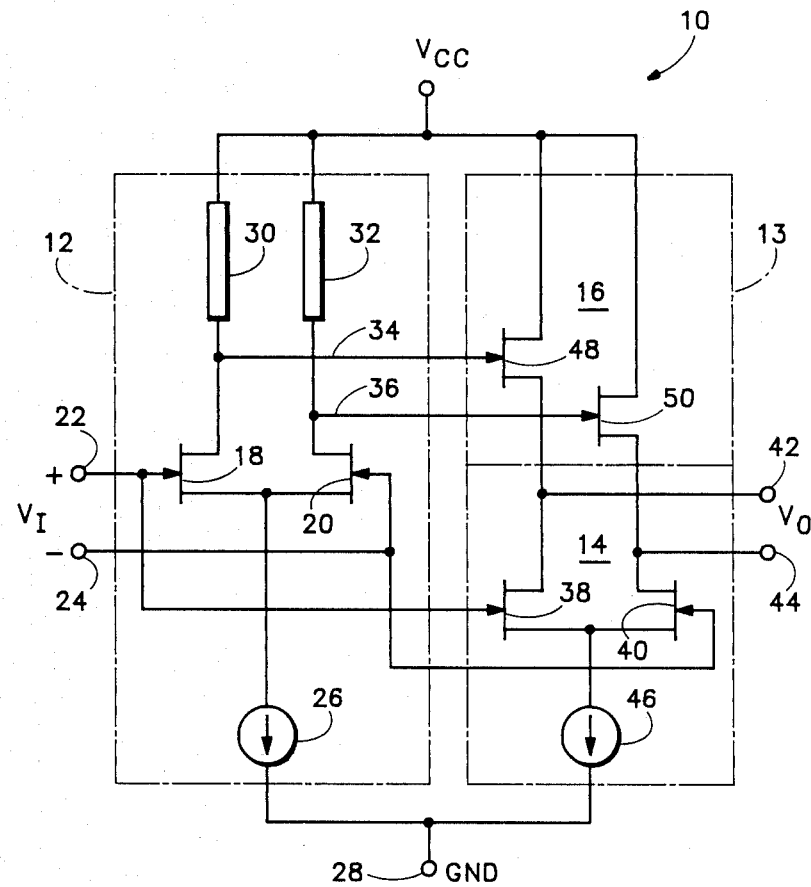

WIDE BANDWIDTH PUSH-PULL PARALLEL AMPLIFIER

BACKGROUND OF THE INVENTION

The present invention relates generally to differential amplifiers, and more particularly to wide bandwidth multiple stage differential amplifiers.

Typical prior art single stage amplifiers are gain bandwidth limited. If the gain is increased, the bandwidth must be proportionally reduced. A similar reduction in bandwidth as well as an increased delay time between input and output occurs if several stages are cascaded together. What is desired is a differential amplifier having an enhanced gain bandwidth product while maintaining the delay of a single stage.

SUMMARY OF THE INVENTION

A wide bandwidth push-pull parallel amplifier circuit according to the present invention includes a main amplifier stage and a parallel transimpedance amplifier stage. The inputs of both amplifier stages are connected in parallel to receive a common differential voltage input signal. The output of the main amplifier stage is coupled to the input of a follower stage, the output of which is summed with the output of the parallel transimpedance amplifier stage to provide a voltage output signal. The resulting push-pull parallel amplifier circuit has a gain bandwidth product exceeding that of a single stage amplifier, while maintaining the delay of a single stage.

BRIEF DESCRIPTION OF THE DRAWING

The sole drawing FIGURE is a schematic diagram of a wide bandwidth push-pull parallel amplifier according to the present invention.

DESCRIPTION OF PREFERRED EMBODIMENT

Referring to the FIGURE, a wide bandwidth push-pull parallel amplifier 10 includes a main amplifier stage 12, and a parallel amplifier stage 13 comprising a transimppedance amplifier 14 and a follower circuit 16. It should be noted at the outset that amplifier circuit 10 may be implemented using discrete components, but typically will be manufactured in integrated circuit form. Accordingly, the narrative that follows will describe an integrated embodiment of the circuit using differential source-coupled field-effect transistor (FET) logic.

Main amplifier 12 includes a pair of FETs 18, 20 connected as shown to form a differential input pair. The gates of transistors 18, 20 are connected to input terminals 22, 24, respectively, to receive differential input voltage signals $V_I$. A constant current source 26 of conventional design is connected between a ground reference terminal 28 and the interconnected source electrodes of the two FETs. The drains of transistors 18, 20 are connected respectively to load impedances 30, 32, which in turn are connected to $V_{CC}$ power source terminal 33. The load impedances may be either passive resistor elements or active current sources of conventional design. Differential output voltage signals from stage 12 are carried by conductors 34, 36 coupled to the interconnections between the drain electrodes of transistors 18, 20 and their respective load impedances.

The gain, designated $A_{VM}$, of the main amplifier stage may determined as follows:

$$\text{Assume: } Z_{30} = Z_{32} = Z \tag{1}$$

$$\text{and } gm_{18} = gm_{20} = gm_M \tag{2}$$

$$\text{Then } A_{VM} = Z gm_M \tag{3}$$

As noted above, parallel amplifier stage 13 comprises a transimpedance amplifier 14 and a follower circuit 16. Amplifier 14 includes a pair of FETs 38, 40. The gates of the two transistors are connected to circuit input terminals 22, 24, and the drains are connected to output terminals 42, 44, as shown. A constant current source 46 is connected between ground terminal 28 and the interconnected source electrodes of transistors 38, 40. Follower circuit 16 comprises a pair of FETs 48, 50, the gates of which are connected respectively to the drains of transistors 18, 20 by conductors 34, 36. The source electrodes of FETs 48, 50 are coupled to circuit output terminals 42, 44, respectively, and their drains are connected to $V_{CC}$ terminal 33. It will be seen that transistors 48, 50 are configured as source followers in that the voltage on the source of each transistor follows the voltage on its gate. Therefore the total gain of the parallel amplifier, designated $A_{VP}$ may be determined in a manner analogous to that of the main amplifier, as follows:

$$\text{Assume: } gm^{48} = gm_{50} = gm_F \tag{4}$$

$$\text{and } gm_{38} = gm_{40} = gm_T \tag{5}$$

$$\text{Then } A_{VP} = gm_T/gm_F \tag{6}$$

It should be noted that once the gains of the main amplifier and the parallel amplifier, $A_{VM}$ and $A_{VP}$ respectively, have been determined, the total gain of amplifier 10, $A_{VC}$, is simply the sum of the two gains. Referring to the FIGURE, it can be determined by inspection that the gain component from the sources of transistors 48, 50 is in phase with and adds to the gain component from the drains of transistors 38 and 40. The total gain $A_{VC}$ is thus:

$$A_{VC} = A_{VM} + A_{VP} \tag{7}$$

Assuming that the bandwidth of the main and parallel amplifiers is equal, the improvement in gain, GI, over that of a single stage amplifier is given by:

$$GI = (A_{VM} + A_{VP})/A_{VM} \tag{8}$$

If FETs 38, 40, 48 and 50 are identical, i.e., of the same size in integrated form, a gain improvement of two is realized while maintaining the same bandwidth and delay as in a single stage amplifier. In other words, there is a factor of two improvement in the gain bandwidth product. However, the ratio between the sizes of transistors 48, 50 and the sizes of transistors 38 and 40 may be varied to produce a corresponding change in the gain improvement. If the gain of the parallel amplifier is significantly increased by increasing the size (width) of transistors 38, 40, the increased capacitance of the transistors will limit the amount of gain bandwidth product improvement that can be obtained.

Although a preferred embodiment of the invention has been described and illustrated in detail, it should be understood that the same is by way of example and illustration only. For example, other amplifier structures, whether differential or single phase, have finite output impedances could be used for the main and parallel amplifier stages. Further, any type of field-effect transistor may be used in the circuit, including n-channel, p-channel, or GaAs devices, as long as correct biasing is provided. The scope of the present invention is therefore limited only by the terms of the appended claims.

I claim:

1. A wide bandwidth push-pull parallel amplifier comprising,
    a main differential amplifier stage that includes a first pair of field effect transistors having their source electrodes coupled to a ground reference terminal via a first constant current source and their drain electrodes individually coupled via first and second load impedances to a supply voltage source,
    a parallel amplifier stage comprising
        a differential amplifier that includes a second pair of field-effect transistors having their source electrodes coupled to the ground reference terminal via a second constant current source, and
        a source follower that includes a third pair of field effect transistors, each having its source electrode coupled to the drain electrode of a corresponding one of the second pair of field-effect transistors, and its gate electrode connected to the drain of a corresponding one of the first pair of field-effect transistors, the drain electrodes of said third pair of transistors being connected to said supply voltage source,
    a pair of input terminals, each connected to the gate electrodes of a different one of the first pair and the second pair of field effect electrodes, and
    a pair of output electrodes, each connected to the drain electrode of a different one of the second pair of field-effect transistors.

2. A wide bandwidth push-pull parallel amplifier comprising
    a main amplifier stage including a pair of field-effect transistors each having a drain, a gate, and a source, the sources being coupled together and to a first current source, the gates forming an input for receiving an input voltage signal and a pair of load impedances respectively coupled between a source of supply voltage and the drain of said pair of transistors to form an output for providing a corresponding voltage output signal, and
    a parallel amplifier stage including
    a follower circuit having an input coupled to the output of said main amplifier stage and an output, and
    a transimpedance amplifier having an input coupled to the input of said main amplifier and an output coupled to the output of said follower circuit to provide a voltage output signal.

3. A wide bandwidth push-pull parallel amplifier comprising
    a main amplifier stage having an input for receiving an input voltage signal and an output for providing a corresponding voltage output signal, and
    a parallel amplifier stage including
    a follower circuit including a pair of field-effect transistors each having a drain, a gate, and a source, the drains being coupled to a source of supply voltage, the gates forming an input coupled to the output of said main amplifier stage and the sources forming an output, and
    a transimpedance amplifier having an input coupled to the input of said main amplifier and an output coupled to the output of said follower circuit to provide a voltage output signal.

4. A wide bandwidth push-pull parallel amplifier comprising
    a main amplifier stage having an input for receiving an input voltage signal and an output for providing a corresponding voltage output signal, and
    a parallel amplifier stage including
    a follower circuit having an input coupled to the output of said main amplifier stage and an output, and
    a transimpedance amplifier including a pair of field-effect transistors each having a drain, a gate, and a source, the sources being coupled together and to a second current source, the gates forming an input coupled to the input of said main amplifier and the drains forming an output coupled to the output of said follower circuit to provide a voltage output signal.

* * * * *